(12) United States Patent
Jeng et al.

(10) Patent No.: US 6,235,621 B1
(45) Date of Patent: May 22, 2001

(54) METHOD FOR FORMING A SEMICONDUCTOR DEVICE

(75) Inventors: Erik S. Jeng; Tzu-Shih Yen, both of Hsinchu; Chi-San Wu, Taipei Hsien; Jong-Bor Wang, Taipei, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/447,008

(22) Filed: Nov. 22, 1999

(51) Int. Cl.⁷ .............................................. H01L 21/3205
(52) U.S. Cl. .......................... 438/592; 438/593; 438/594
(58) Field of Search .................................. 438/592, 595, 438/588, 739, 742, 743, 744, 738, 593, 594

(56) References Cited

U.S. PATENT DOCUMENTS

| | | | |
|---|---|---|---|
| 5,698,072 | * 12/1997 | Fukuda | 438/721 |
| 5,880,035 | * 3/1999 | Fukuda | 438/734 |
| 5,994,237 | * 11/1999 | Becker et al. | 438/734 |
| 5,998,290 | * 12/1999 | Wu et al. | 438/595 |

* cited by examiner

*Primary Examiner*—David Nelms
*Assistant Examiner*—Dung A Le

(57) ABSTRACT

A method for fabricating semiconductor device is disclosed herein. The first step is to form a first oxide layer on a substrate. Subsequently formed are polycrystalline silicon layer, a polycide layer, optionally a second oxide layer, and a silicon nitride layer on the first oxide layer. A photoresist pattern on the silicon layer is formed thereafter, and the silicon nitride layer is etched using the photoresist pattern as a mask to expose a portion of the polycide layer. The photoresist pattern is then, the polycide layer is isotropically etched to form an under cut in the polycide layer under the etched nitride layer (optional second oxide layer). The width of the top portion of the isotropically etched polycide layer is smaller than the width of the etched nitride layer. The isotropically etched polycide layer is then anistropically etched, and the polycrystalline layer is etched to expose a portion of the first oxide layer to form a multi-layer structure. Finally, spacers on side-walls of the multi-layer structure are formed to create the semiconductor device, the side-wall of the anisotropicaly etched polycide layer generated after the oxidation process is prevented from penetrating the spacer of the semiconductor device according to the present invention.

8 Claims, 6 Drawing Sheets

METHOD FOR FORMING A SEMICONDUCTOR DEVICE

BACKGROUND OF THE INVENTION

1. Field of the Invention

This invention relates to a method for fabricating a semiconductor device, and more particularly, to a method for fabricating a semiconductor device by using self-align contact (SAC).

2. Description of the Prior Art

With the advent of Ultra Large Scale Integrated (ULSI) semiconductor devices, the size of the semiconductor device becomes smaller and smaller such that the width of a single semiconductor device has become very small. The manufacture of a semiconductor device usually includes the fabrication of the transistor, the bit line, and the word line, and further includes the contacts. The devices of small area in the semiconductor device with self align contact technology are thus very important for the designer.

The traditional technology employed to fabricate the semiconductor device with the polycide gate using self-align contact often suffers from the rough side-wall after LDD oxidation mainly due to the extruded oxides of polycide. This phenomenon mentioned above frequently results in rough and extruding side-wall which degrades the isolation between polycide gates and self-align contacts.

Taking the method for fabricating a semiconductor device, such as a word line or a transistor, as an example, the transistor-manufacturing method is illustrated as prior art. When the substrate 10 is provided in the manufacturing process, the gate oxide layer 11, the polycrystalline silicon layer 12, and the tungsten silicide layer 13 are subsequently formed on the substrate 10. Next, a TEOS oxide layer 14 is optionally formed on the tungsten silicide layer 13. The TEOS oxide layer 14 can be formed by the CVD (Chemical Vapor Deposition) method. The silicon nitride layer 15 is formed on the TEOS oxide layer 14, and then the photoresist layer 16 is used as a mask when anisotropically etching the silicon nitride layer 15 and the TEOS oxide layer 14. Next, referring to FIG. 1B, photoresist layer 16 is stripped and the polycrystalline silicon layer 12 and the tungsten silicide layer 13 are anisotropically etched to form the multi-layer. The multi-layer above includes the etched polycrystalline silicon layer 12, the etched tungsten silicide layer 13, the etched TEOS oxide layer 14, and the etched silicon nitride layer 15.

Referring to FIG. 1C, the spacer 20 is formed on the side-wall of the foregoing multi-layer to finish the semiconductor device. However, during the subsequent processes, the oxidation process and the self-align technology are employed to proceed with the semiconductor device. The dielectric layer 25, such as an oxide layer, referring to FIG. 1D, formed on the semiconductor device is then etched to form a contact hole. A portion of the substrate 10 is exposed, and then a conductive layer 30 is formed and patterned on the exposed portion of the spacer 20 and the exposed portion of the gate oxide layer 11. The dielectric layer 25 and the subsequent processes are performed to manufacture the semiconductor device.

When the oxidation process is applied to the semiconductor device mentioned above, the polycrystalline silicon generated from the side-wall of the tungsten silicide layer 13 will result in a rough and extruded side-wall which degrades the isolation between polycide gates and self-align contacts. The phenomenon mentioned above results from the portion 35 of the thickness reduced spacer 20.

SUMMARY OF THE INVENTION

Due to the issues mentioned above, it is important to prevent the reduction of isolation margin resulting from the polycide generated on the side-wall of the multi-layer in the subsequent oxidation process. The present invention proposes a simple and practical method of fabricating the semiconductor device utilizing self-align technology, which can increase the isolation margin between the polycide gate and the self-align contact. A method for fabricating semiconductor device is disclosed herein.

The first step is to form a first oxide layer on a substrate. Then subsequently form a polycrystalline silicon layer, a polycide layer, optionally a second oxide layer, and a silicon nitride layer on the first oxide layer. A photoresist pattern is formed on the silicon layer, and the silicon nitride layer is etched using the photoresist pattern as a mask to expose a portion of the polycide layer. Followed by stripping the photoresist pattern, the polycide layer is isotropically etched to form an under cut in the polycide layer under the etched nitride layer (optionally a second oxide layer).

The width of the top portion of the isotropically etched polycide layer is smaller than the width of the etched nitride layer. Subsequently, the isotropically etched polycide layer is anistropically and the polycrystalline layer is etched until a portion of the first oxide layer is exposed to a multi-layer structure. Finally, form spacers are formed on side-walls of the multi-layer structure to form the semiconductor device, the side-wall of the anisotropicaly etched polycide layer generated after the oxidation process is prevented from penetrating the spacer of the semiconductor device according to the present invention.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1A:
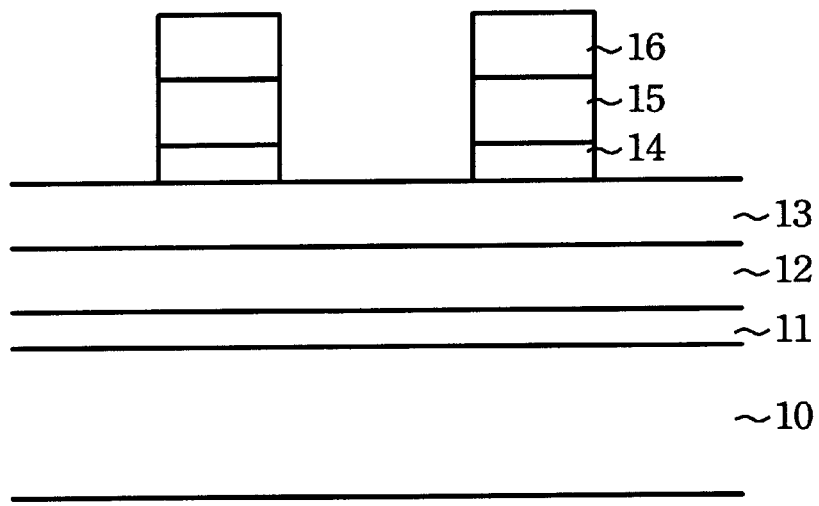
FIG. 1A illustrates the cross section of the prior art structure of the semiconductor device before the conductive structure (tungsten silicide layer) is etched.
Figure 1B:
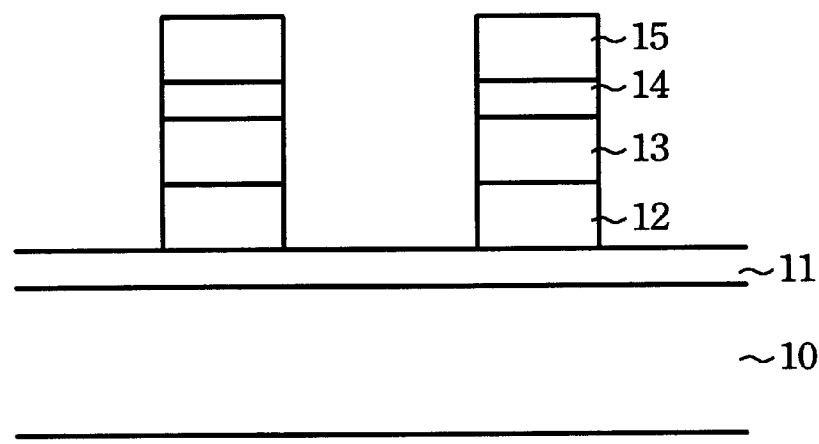
FIG. 1B illustrates the cross section of the prior art structure of the semiconductor device when the multi-layer structure is formed.
Figure 1C:
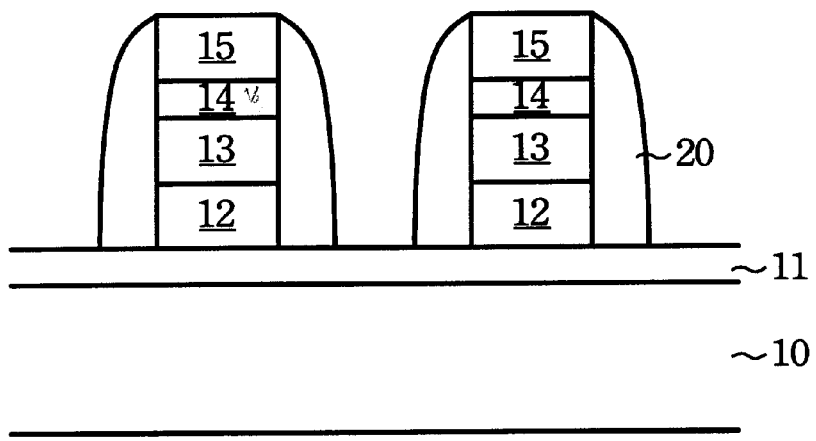
FIG. 1C illustrates the cross section of the prior art structure of the semiconductor device after the spacer has been formed on the side-wall of the multi-layer structure.
Figure 1D:
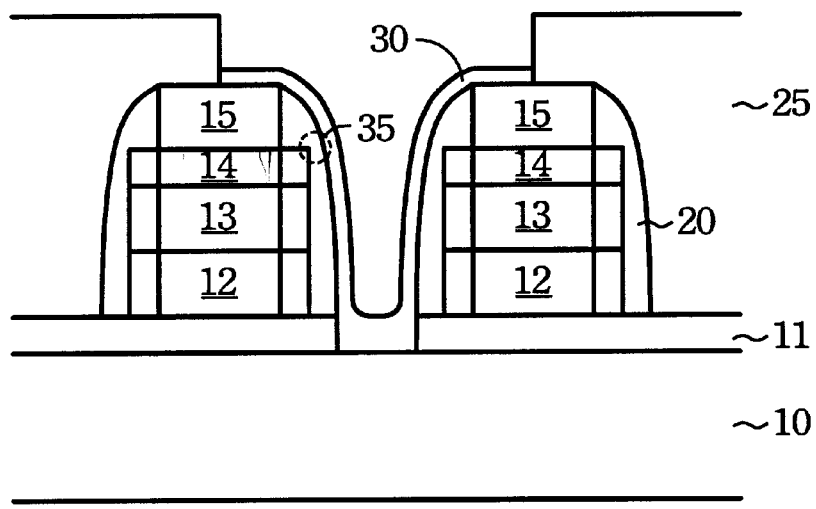
FIG. 1D illustrates the cross section of the prior art structure of the semiconductor device when the self-align technology is utilized and the conductive layer is pattern in the contact.

In fabricating the semiconductor device, such as a word line, a bit line, or a transistor, the self-align technology is often used, and the LDD oxidation process is also frequently used. However, the rough and extruded side-wall of the manufactured semiconductor device must be eliminated, and the degradation of the isolation between the polycide gates and self-align contacts is avoided.

In one preferred embodiment of the present invention, the method for fabricating a semiconductor device, such as a word line, or a transistor is described in the specification. The substrate 40 is provided in the manufacturing process, the gate oxide layer 41, the polycrystalline silicon layer 42, and the tungsten silicide layer 43 are subsequently formed on the substrate 40. Next, a TEOS oxide layer 44 is optionally formed on the tungsten silicide layer 43. The TEOS oxide layer 44 in one preferred embodiment of the present invention can be formed by the CVD (Chemical Vapor Deposition) method. In other words, the deposition of the TEOS oxide layer 44 can be omitted in the other semiconductor manufacturing process. Then the silicon nitride layer 45 is formed on the TEOS oxide layer 44, and then the photoresist layer 46 is spun on, exposed, and developed on the silicon nitride layer 45. The photoresist layer 46 is used as a mask when anisotropically etching the silicon nitride layer 45 and the TEOS oxide layer 44.

Figure 2A:
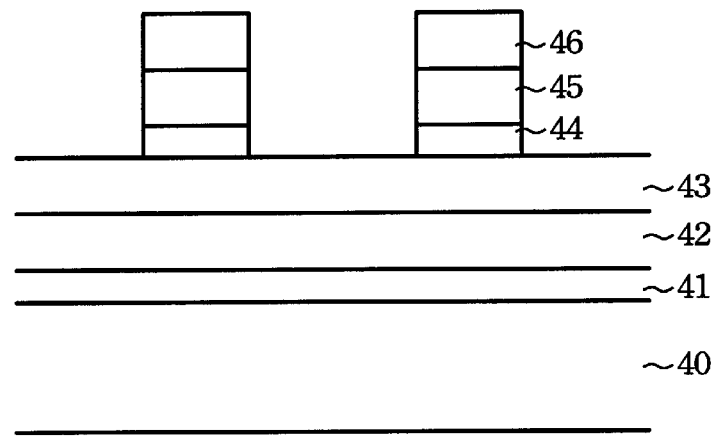
FIG. 2A illustrates the cross section according to one preferred embodiment of the present invention of the semiconductor device before the conductive structure (tungsten silicide layer) is etched.
Figure 2B:
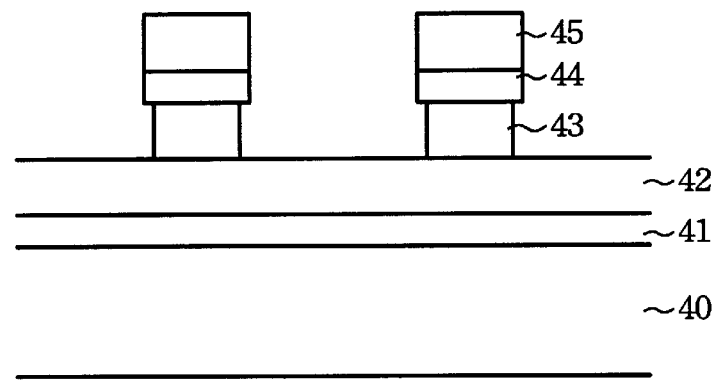
FIG. 2B illustrates the cross section according to one preferred embodiment of the present invention of the semiconductor device when the polycide layer has been patterned and further etched.

Next, referring to FIG. 2B, the photoresist layer 46 is stripped. This step is followed by an anisotropic etching step that is used to etch the tungsten silicide layer 43 by using the silicon nitride layer 45 as a mask, and then a selective wet etching step is utilized to laterally etch the tungsten silicide layer 43, and the tungsten suicide layer 43 shrinks thereby. The selective wet etching step mentioned above utilizes the APM solution to etch the silicon nitride layer 45, and has the etching selectivity to tungsten silicide layer 43 of no less than 100. The APM solution mentioned above includes the mixtures $NH_3/H_2O_2/H_2O$ of the ratio from about 1:1:5 to about 1:5:20.

Figure 2C:
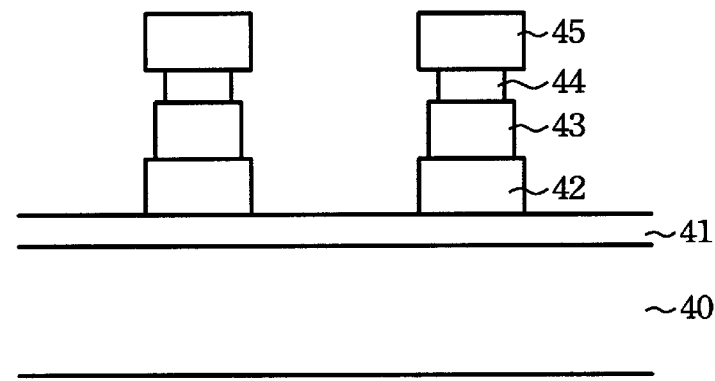
FIG. 2C illustrates the cross section according to one preferred embodiment of the present invention of the semiconductor device after the optional second oxide layer is further etched and the polycrystalline silicon layer has been etched to form the multi-layer structure according to the present invention.

Optionally, when the TEOS oxide layer 44 has been deposited on the tungsten silicide layer 43, the TEOS oxide layer 44 is subsequently etched by utilizing diluted HF/BOE (Buffer Oxide Etching) solution. Referring to FIG. 2C, the next step is to etch the polycrystalline silicon layer 42 by using the silicon nitride layer 45 as a mask. The multi-layer structure is formed, which includes the etched polycrystalline silicon layer 42, the etched tungsten silicide layer 43, the etched TEOS oxide layer 44, and the etched silicon nitride layer 45.

Figure 2D:
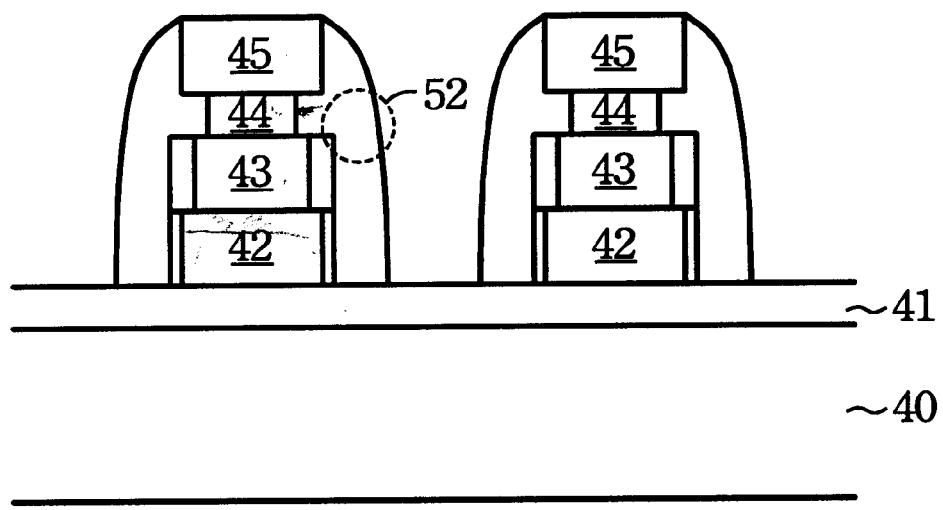
FIG. 2D illustrates the cross section according to one preferred embodiment of the present invention of the semiconductor device after the spacer has been formed on the side-wall of the multi-layer structure, and the polycide layer is generated on the side-wall of the multi-layer structure due to the subsequent oxidation process.
Figure 2E:
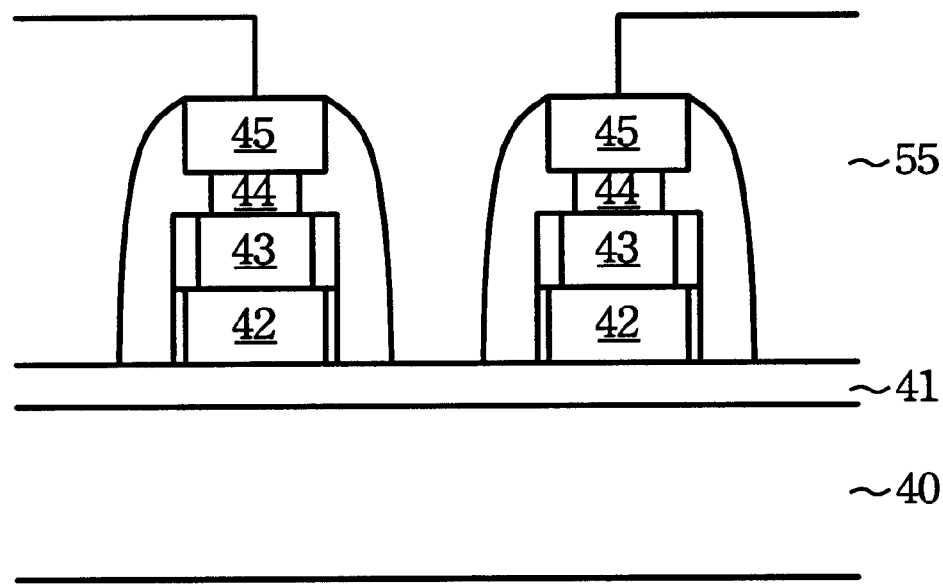
FIG. 2E illustrates the cross section according to one preferred embodiment of the present invention of the semiconductor device after the dielectric layer has been formed on the semiconductor device.

Referring to FIG. 2D, a spacer 50 is formed on the side-wall of the foregoing multi-layer structure, and the spacer can be made of silicon nitride. During the subsequent processes, although the oxidation process can be employed to proceed with the multi-layer structure of a semiconductor device, an extruded polycide 52 on the side-wall of the etched tungsten silicide layer 43 can be produced. The distance between the surface of the spacer 50 and the extruded polycide 52 is still smaller than that of the prior art due to the selective etching process. When a self-align technology is employed to manufacture the semiconductor device mentioned above, the dielectric layer 55 is formed and patterned on the semiconductor device to expose a portion of the gate oxide layer 41 and a portion of the spacer 50. The other processes can be applied to the semiconductor device mentioned above, such as a gate electrode, to manufacture the other kind of device (not shown), such as a transistor.

Figure 3A:
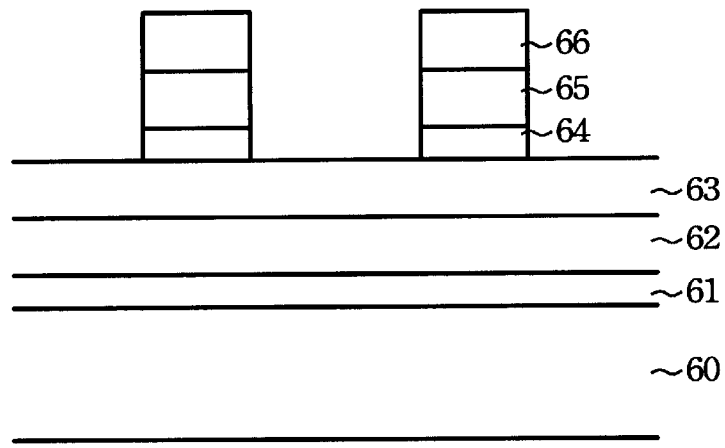
FIG. 3A illustrates the cross section according to the other preferred embodiment of the present invention of the semiconductor device before the conductive structure (tungsten suicide layer) is etched.
Figure 3B:
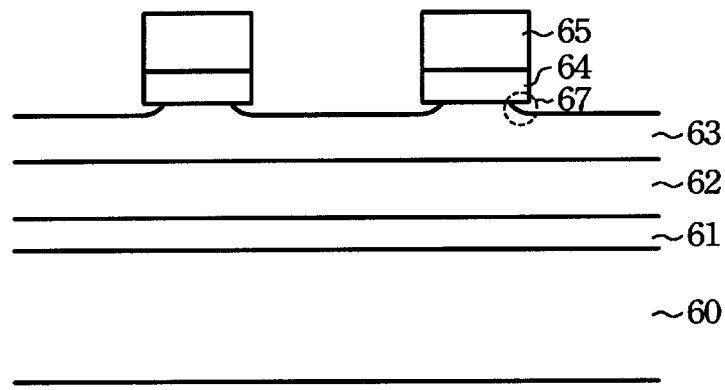
FIG. 3B illustrates the cross section according to the other preferred embodiment of the present invention of the semiconductor device when the polycide layer has been patterned and isotropically etched.

In the other preferred embodiment of the present invention, the method for fabricating a semiconductor device is described in the specification. The substrate 60 is provided in the manufacturing process, the gate oxide layer 61, the polycrystalline silicon layer 62 and, the tungsten silicide layer 63 are subsequently formed on the substrate 60. Next, a TEOS oxide layer 64 is optionally formed on the tungsten silicide layer 63. In other words, the deposition of the TEOS oxide layer 64 can be omitted in the other semiconductor manufacturing process. Then the silicon nitride layer 65 is formed on the TEOS oxide layer 64, and then the photoresist layer 66 is spun on, exposed, and developed on the silicon nitride layer 65. The photoresist layer 66 is used as a mask, when anisotropically etching the silicon nitride layer 65 and the TEOS oxide layer 64. Then, referring to FIG. 3B, a selective wet etching step is utilized to etch the tungsten silicide layer 63, and an undercut 67 is formed in the tungsten silicide layer 63 under the TEOS oxide layer 64, and a portion of the tungsten silicide layer 63 shrinks thereby. The selective wet etching step mentioned above utilize the APM solution to etch the tungsten suicide layer 63 of, and has the etching selectivity ratio to tungsten silicide layer 63 no less than 100. The APM solution mentioned above includes the mixtures $NH_3/H_2O_2/H_2O$ of a ratio from about 1:1:5 to about 1:5:20.

Figure 3C:
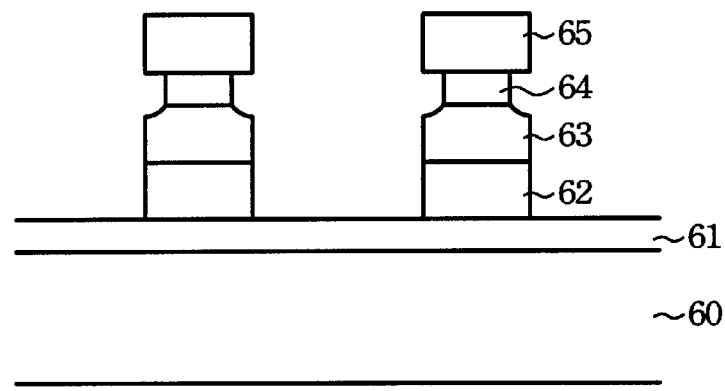
FIG. 3C illustrates the cross section according to the other preferred embodiment of the present invention of the semiconductor device after the optional second oxide layer is further etched and the polycrystalline silicon layer has been etched to form the multi-layer structure according to the present invention.

Next, the photoresist layer 66 is stripped, and then when the TEOS oxide layer 64 has been deposited on the tungsten silicide layer 63, the TEOS oxide layer 64 is subsequently etched utilizing diluted HF/BOE (Buffer Oxide Etching) solution. Referring to FIG. 3C, the next step is to etch the tungsten silicide layer 63 and the polycrystalline silicon layer 62 by using the silicon nitride layer 65 as a mask. The multi-layer is thus formed, which includes the etched polycrystalline silicon layer 62, the etched tungsten silicide layer 63, the etched TEOS oxide layer 64, and the etched silicon nitride layer 65. It is noted that the top portion of the etched tungsten silicide layer 63 shrinks because the undercut 67 and the TEOS oxide layer 64 shrink too.

Figure 3D:
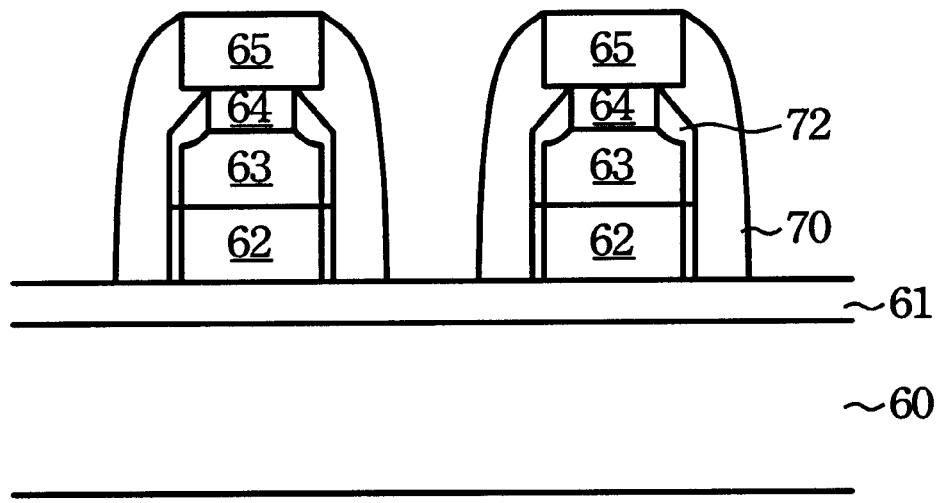
FIG. 3D illustrates the cross section according to the other preferred embodiment of the present invention of the semiconductor device after the spacer has been formed on the side-wall of the multi-layer structure, and the polycide layer is generated on the side-wall of the multi-layer structure due to the subsequent oxidation process.
Figure 3E:
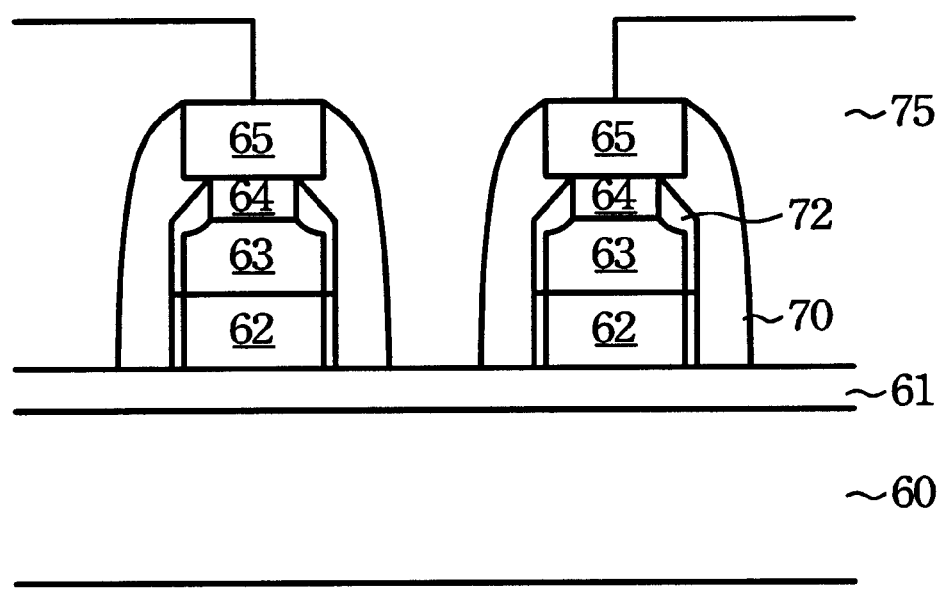
FIG. 3E illustrates the cross section according to the other preferred embodiment of the present invention of the semiconductor device after the dielectric layer has been formed on the semiconductor device, the dielectric layer is of the same material as that of the spacer.

Referring to FIG. 3D, a spacer 70 is formed on the side-wall of the foregoing multi-layer, and the spacer 70 can be made of silicon nitride. During the subsequent processes, although the oxidation process can be employed to proceed with the semiconductor device, an extruded polycide 72 can be produced on the side-wall of the etched tungsten silicide layer 63. The distance between the surface of the spacer 70 and the extruded polycide 72 is still less than that of the prior art.

When a self-align technology is employed to the semiconductor device mentioned above, the dielectric layer 75 is formed and patterned on the semiconductor device to expose a portion of the gate oxide layer 61 and a portion of the spacer 70. The other processes can be applied to the semiconductor device mentioned above, such as a gate electrode, to manufacture the other kind of device, such as a transistor. Because the following processes utilized to manufacture the other kind of device is not the key point of the present invention, it is not illustrated in the figures of the specification, and is not detailed in the specification. The shrinkage of the suicide layer (tungsten silicide layer in the preferred embodiment of the present invention) and the oxide layer (TEOS oxide layer in the preferred embodiment of the present invention) increases the distance from the extruded polycide to the surface of the spacer of the semiconductor device. Thus the isolation margin between the polycide gate and the self-align contacts of the semiconductor device is increased in the present invention. In the specification of the present invention, the TEOS oxide layer can be made of materials other than oxide, and the spacer on side-walls of the multi-layer structure (including the shrinking polycide layer) of the semiconductor device can prevent the extruded poly-silicon from penetrating the spacer.

As will be understood by persons skilled in the art, the foregoing preferred embodiments of the present invention are illustrative of the present invention rather than limiting the present invention. Having described the invention in connection with a preferred embodiment, for example, other etchants may be used in the preferred embodiments, as long as the previously-etching-silicide method is used to increase the isolation margin of the semiconductor device is essentially the same as that disclosed herein, the modification will now suggest itself to those skilled in the art. While the preferred embodiments of the invention have been illustrated and described, it will be appreciated that various changes can be made therein without departing from the spirit and scope of the invention.

What is claimed is:

1. A method for forming a semiconductor device, said method comprising the following steps:
   forming a first oxide layer on a substrate;
   forming a polycrystalline silicon layer on said first oxide layer;
   forming a tungsten silicide layer on said polycrystalline silicon layer;
   forming a second oxide layer on said tungsten silicide layer;
   forming a silicon nitride layer on said second oxide layer;
   forming a photoresist pattern on said silicon nitride layer;
   anisotropically etching a portion of said silicon nitride layer, said second oxide layer, and said tungsten silicide layer to expose a portion of said polycrystalline layer by using said photoresist pattern as an etching mask;
   stripping said photoresist pattern;
   isotropically etching said tungsten silicide layer for eroding side walls of said tungsten silicide retreating to a boundary shadowed by said silicon nitride layer;
   isotropically etching said second oxide layer for eroding side walls of said second oxide layer retreating to a boundary shadowed by said silicon nitride layer;
   etching said polycrystalline layer till exposing a portion of said first oxide layer to form a multi-layer structure; and
   forming a spacer on side-walls of said multi-layer structure to form said semiconductor device, thereby Preventing said tungsten silicide layer from penetrating said spacer during successive thermal processes.

2. The method as claim 1, wherein said second oxide layer is etched by a mixture of diluted HF/BOE (Buffer Oxide Etching) solution.

3. The method as claim 1, wherein said tungsten silicide layer is anisotropically etched by a mixture of NH3/H2O2/H2O about of the ratio from 1:1:5 to about 1:5:20.

4. The method as claim 1, wherein said spacer comprises silicon nitride.

5. A method for forming a semiconductor device, said method comprising the following steps:
   forming a first oxide layer on a substrate;
   forming a polycrystalline silicon layer on said first oxide layer;
   forming a tungsten silicide layer on said polycrystalline silicon layer;
   forming a second oxide layer on said tungsten silicide layer;
   forming a silicon nitride layer on said second oxide layer;
   forming a photoresist pattern on said silicon nitride layer;
   anisotropically etching a portion of said silicon nitride layer and said second oxide layer, to expose a portion of said tungsten silicide layer by using said photoresist layer as an etching mask;
   stripping said photoresist pattern;
   isotropically etching said tungsten silicide layer to form an under cut in peripheral areas of said tungsten silicide layer shadowed by said silicon nitride layer;
   anisotropically etching said tungsten silicide layer down to said polycrystalline layer by using said silicon nitride layer as an etching mask;
   etching said polycrystalline layer till exposing a portion of said first oxide layer to form a multi-layer structure; and
   forming spacers on side-walls of said multi-layer structure to form said semiconductor device, thereby preventing said tungsten silicide layer from penetrating said spacer during successive thermal processes.

6. The method as claim 5, wherein said second oxide layer is etched by a mixture of diluted HF/BOE (Buffer Oxide Etching) solution.

7. The method as claim 5, wherein said tungsten silicide laver is anisotropically etched by a mixture of NH3/H2O2/H2O about of the ratio from 1:1:5 to about 1:5:20.

8. The method as claim 5, wherein said spacer comprises silicon nitride.

* * * * *